US009356136B2

(12) United States Patent
Lu et al.

(10) Patent No.: US 9,356,136 B2
(45) Date of Patent: May 31, 2016

(54) ENGINEERED SOURCE/DRAIN REGION FOR N-TYPE MOSFET

(71) Applicant: Taiwan Semiconductor Manufacturing Co. Ltd., Hsin-Chu (TW)

(72) Inventors: Wei-Yuan Lu, Taipei (TW); Lilly Su, Chubei (TW); Chun-Hung Huang, Zhubei (TW); Chii-Horng Li, Zhubei (TW); Jyh-Huei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 43 days.

(21) Appl. No.: 13/788,524

(22) Filed: Mar. 7, 2013

(65) Prior Publication Data
US 2014/0252468 A1    Sep. 11, 2014

(51) Int. Cl.
*H01L 29/78* (2006.01)
*H01L 29/66* (2006.01)
*H01L 29/16* (2006.01)
*H01L 21/8234* (2006.01)
*H01L 29/08* (2006.01)
*H01L 29/165* (2006.01)

(52) U.S. Cl.
CPC .... *H01L 29/7816* (2013.01); *H01L 21/823418* (2013.01); *H01L 29/086* (2013.01); *H01L 29/0843* (2013.01); *H01L 29/0869* (2013.01); *H01L 29/0878* (2013.01); *H01L 29/0886* (2013.01); *H01L 29/1608* (2013.01); *H01L 29/6606* (2013.01); *H01L 29/66053* (2013.01); *H01L 29/6659* (2013.01); *H01L 29/66068* (2013.01); *H01L 29/66628* (2013.01); *H01L 29/66636* (2013.01); *H01L 29/66689* (2013.01); *H01L 29/7834* (2013.01); *H01L 29/7842* (2013.01); *H01L 29/7848* (2013.01); *H01L 29/165* (2013.01); *H01L 29/66545* (2013.01)

(58) Field of Classification Search
CPC ... H01L 29/7827; H01L 29/78; H01L 29/785; H01L 29/66666; H01L 29/7378; H01L 29/1054; H01L 29/7842
USPC ............ 257/337, 190, 365, 329, E29.264, 257/E29.275, E29.319, E29.421; 438/268
See application file for complete search history.

(56) References Cited

U.S. PATENT DOCUMENTS

| | | | |
|---|---|---|---|
| 2002/0190322 A1* | 12/2002 | Mouli | 257/347 |
| 2008/0290370 A1* | 11/2008 | Han et al. | 257/192 |
| 2009/0134381 A1* | 5/2009 | Shimamune et al. | 257/19 |
| 2009/0246921 A1* | 10/2009 | Cheng et al. | 438/221 |
| 2010/0012988 A1* | 1/2010 | Yang et al. | 257/288 |

(Continued)

*Primary Examiner* — Fei Fei Yeung Lopez
(74) *Attorney, Agent, or Firm* — Eschweiler & Associates, LLC

(57) ABSTRACT

Integrated circuit devices with field effect transistors have source and drain regions that include a first and a second layer. The first layer is formed below the plane of the channel region. The first layer includes doped silicon and carbon that has a crystal lattice structure that is smaller than that of silicon. The second layer is formed over the first layer and rises above the plane of the channel region. The second layer is formed by a material that includes doped epitaxially grown silicon. The second layer has an atomic fraction of carbon less than half that of the first layer. The first layer is formed to a depth at least 10 nm below the surface of the channel region. This structure facilitates the formation of source and drain extension areas that form very shallow junctions. The devices provide sources and drains that have low resistance while being comparatively resistant to short channel effects.

19 Claims, 3 Drawing Sheets

(56) References Cited

U.S. PATENT DOCUMENTS

| | | | |
|---|---|---|---|
| 2010/0295127 A1* | 11/2010 | Cheng et al. | 257/347 |
| 2011/0068396 A1* | 3/2011 | Cheng et al. | 257/335 |
| 2011/0147828 A1* | 6/2011 | Murthy et al. | 257/327 |
| 2011/0254105 A1 | 10/2011 | Cheng et al. | |
| 2012/0091540 A1 | 4/2012 | Cheng et al. | |
| 2012/0100686 A1 | 4/2012 | Lu et al. | |
| 2013/0032877 A1* | 2/2013 | Ostermay et al. | 257/329 |
| 2013/0168743 A1* | 7/2013 | Dove | 257/288 |
| 2014/0134818 A1* | 5/2014 | Cheng et al. | 438/300 |

\* cited by examiner

ENGINEERED SOURCE/DRAIN REGION FOR N-TYPE MOSFET

FIELD

The present disclosure relates to integrated circuit devices having n-type MOSFETs and methods of their fabrication.

BACKGROUND

As integrated circuit devices are scaled down, designers face a tradeoff between short channel effects and source/drain resistance. Greater source/drain doping to reduce resistance increases junction depth and related short channel effects.

DETAILED DESCRIPTION

The present disclosure provides integrated circuit devices. The devices include a semiconductor body, typically comprising crystalline silicon. A field effect transistor is formed on the semiconductor body including a channel region formed in the semiconductor body. Source and drain regions for the transistor include first and second layers. The first layer is formed below a plane of the upper surface of the channel region. The first layer is formed by a material that includes doped SiC having a crystal lattice structure smaller than that of silicon. The second layer is formed over the first layer and rises above the plane of the upper surface of the channel region. The second layer is formed by a material that includes doped epitaxially grown silicon. The second layer has an atomic fraction of carbon less than half that of the first layer. In one embodiment the first layer is formed to a depth at least 10 nm below the surface of the channel region. This structure facilitates the formation of source and drain extension areas that form very shallow junctions. The devices provide sources and drains that have low resistance while being comparatively resistant to short channel effects.

The present disclosure also provides a method of forming integrated circuit devices. The method includes providing a semiconductor body and forming a stack on the body. The method includes gate-first and gate-last process embodiments and the stack is either a gate or dummy gate stack accordingly. The stack is patterned to remove the stack from source and drain regions for gates while leaving the stack over body regions that will provide channel regions for the gates. Spacers are formed to the sides of the gate locations. Trenches are formed in the semiconductor body in the source and drain regions. A first layer is formed in the trenches by cyclical deposition and etching in one embodiment. The first layer includes silicon, carbon, and phosphorus. A second layer is formed over the first layer by epitaxial growth in one embodiment. The second layer includes silicon and phosphorus. The first and second layers provide source and drain regions for the transistors. Thermal annealing causes phosphorus to diffuse from at least the second layer. The diffused phosphorus determines the locations of p-n junctions between the source and drain regions and the channel regions.

Figure 1:
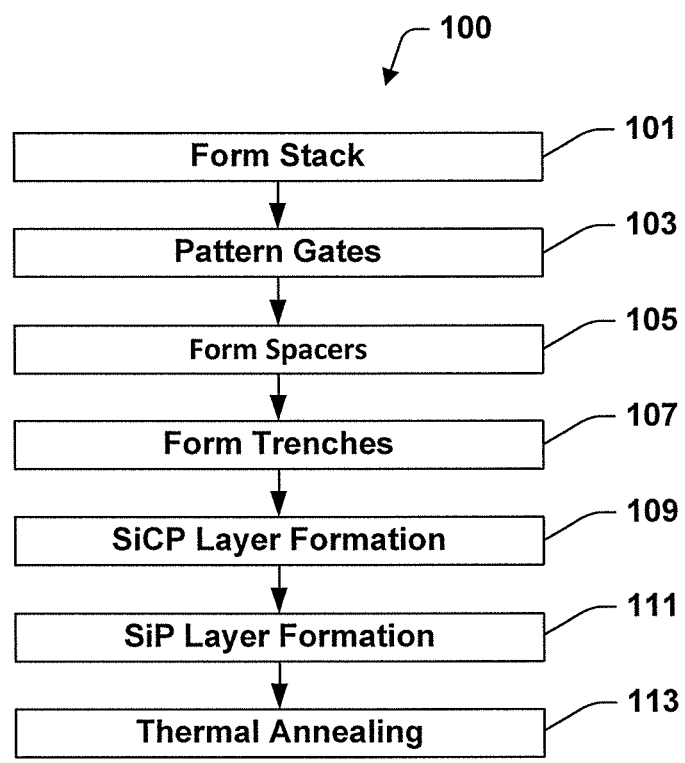
FIG. 1 is flow chart of an example process according to one embodiment.
Figure 2:
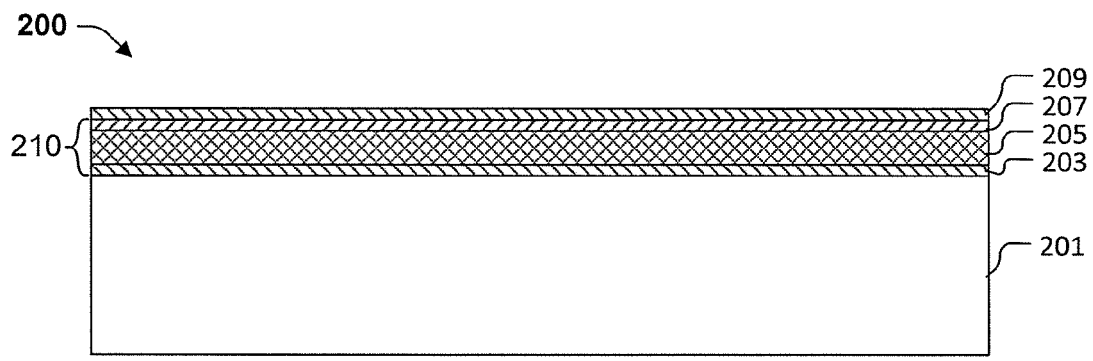
FIGS. 2-8 provide cross-sectional views of an example device at various stages of fabrication according to one embodiment.
Figure 3:
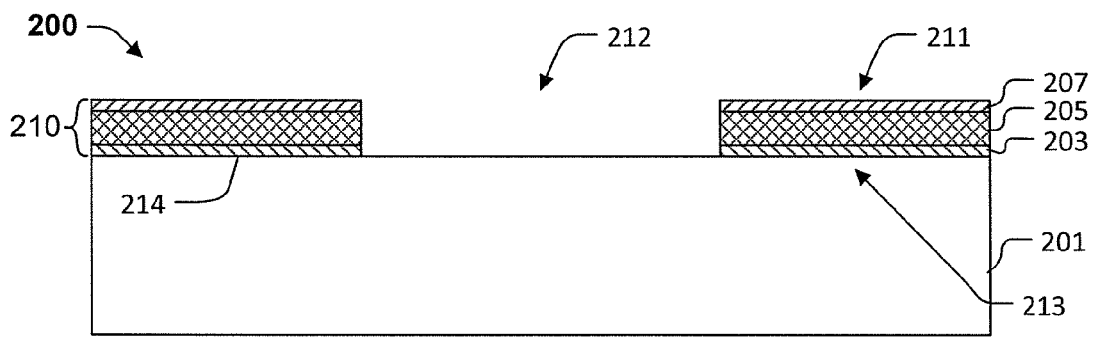

FIG. 1 is a flowchart illustrating a method 100 for fabricating the device 200. FIGS. 2-8 provide cross-sectional views of the device 200 at various stages of fabrication. It should be understood that additional processing may occur before, during, and after the illustrated actions of the method 100 to complete formation of the device 200.

The process 100 begins with act 101, which provides a stack 210 on a semiconductor body 201. The semiconductor body 201 may comprise crystalline silicon, doped or undoped, or a semiconductor-on-insulator (SOI) structure. Generally, an SOI structure comprises a layer of a semiconductor material, such as silicon in crystalline form, over an insulating layer. The insulating layer may be, for example, a buried oxide (BOX) layer or a silicon oxide layer. The insulating layer is provided on a substrate, typically a silicon or glass substrate. Other semiconductor bodies, such as a multi-layered substrate or gradient substrate may also be used. The crystalline portion of the semiconductor may alternatively be Ge, a SiGe, a group III-V material, or the like.

The stack 210 is one or more layers provided either for a gate stack or a dummy gate stack. FIGS. 2-8 provide an example in which the gate stack 210 includes three layers: a dielectric layer 203, an electrode layer 205, and a hard mask layer 207. To allow for reduced critical dimensions, the device 200 may utilize high-k dielectrics and metal electrodes in place of more traditional gate materials. Suitable metals for gate electrodes may be adversely affected by processing used to form source and drain regions. Such damage can be avoided by using a replacement gate (gate-last) process.

In some embodiments, the process 100 is a replacement gate process. In a replacement gate process, the gate stack 210 is formed with a sacrificial material such as polysilicon in place of the electrode metal. Optionally, the place of the dielectric layer 203 is also held by a sacrificial material. In the replacement gate process, the sacrificial materials are removed and the desired gate materials are deposited subsequent to act 113, thermal annealing.

The process 100 of FIG. 1 continues with act 103, patterning the stack 210. The pattern defines locations for the gates 211 and removes the gate stack 210 from source and drain regions 212. Patterning generally includes providing a lithographic mask 209, photolithography to pattern the mask, and etching to transfer the pattern of the mask to underlying layers. The lithographic mask 209 is removed, resulting in the structure illustrated by FIG. 3

Figure 4:
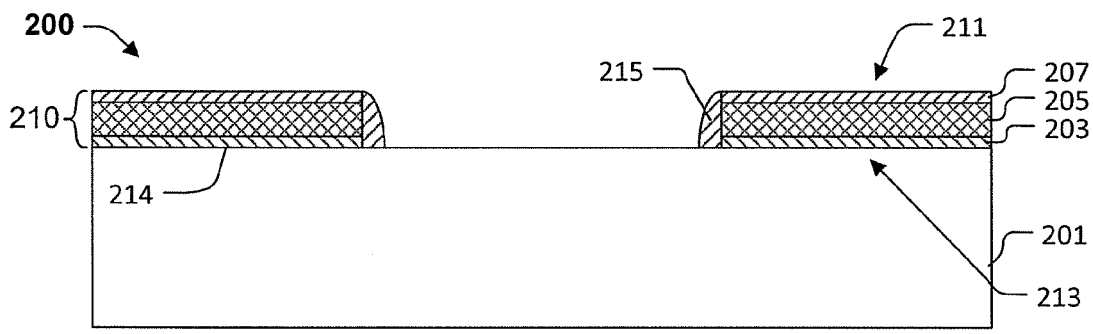

The process 100 continues with act 105, forming spacers 215 adjacent to the gate locations 211 as illustrated by FIG. 4. The spacers 215 may be formed by depositing and patterning a dielectric layer. In some embodiments, the spacers 215 include a silicon nitride layer on a silicon dioxide layer. In alternative embodiments, the spacers 215 include one or more layers of suitable materials. Suitable materials can include, for example, silicon dioxide, silicon nitride, silicon oxynitride (SiON). The spacer material can be deposited using any suitable technique. Suitable techniques may include, for example, plasma enhanced chemical vapor deposition (PECVD), low-pressure chemical vapor deposition (LPCVD), sub-atmospheric chemical vapor deposition (SACVD), and the like. The spacers 215 can be patterned by any suitable process, for example, an anisotropic etch.

Figure 5:
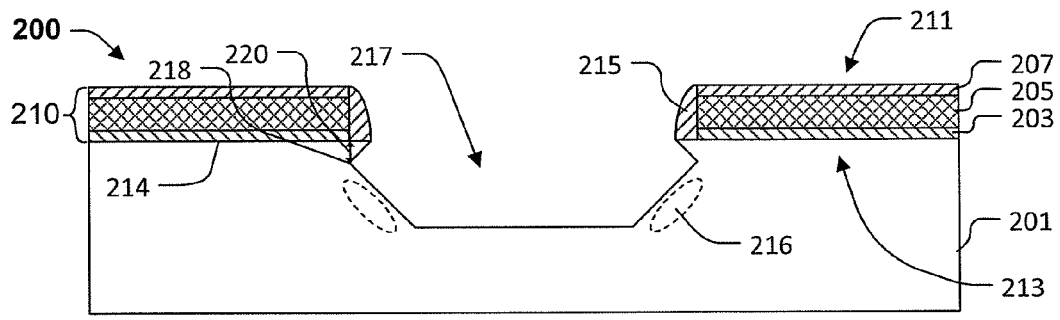

The process 100 continues with act 107, forming trenches 217 in the semiconductor body 201 at desired locations for source and drain regions 212 as illustrated by FIG. 5. In some embodiments, act 107 is an anisotropic wet etch process. An anisotropic wet etch can be a wet etch process that is selective according to crystal surface orientation. The etch can use, for example, tetra-methyl ammonium hydroxide (TMAH) solution in a volume concentration range of 1% to 10% and a temperature in the range from 15° C. to 50° C. This solution is suitable for etching for a silicon crystal semiconductor body 201 in one embodiment. The anisotropic etch can produce trenches with tips 218. In some embodiments, the tips 218 are a distance 220 that is 6 nm or less below the surface 214 of the semiconductor body 201, which will become the surface of the channel region. In some embodiments, the tips 218 are 3 nm or less below the surface 214 of the semiconductor body 201, for example, 2 nm below. A shallow depth for the tips 218 facilitates the formation of a shallow junctions.

In some embodiments of process 100, pocket/halo regions 216 at locations illustrated by FIG. 5 are implanted subsequent to act 107. Pocket regions 216 can be implanted with electrically neutral dopants, for example, that inhibit diffusion of electrically active dopants such as phosphorus. Examples of dopants that can be suitable for this purpose include nitrogen and fluorine. Pocket implants 216 can be formed by any suitable ion implantation process. On the other hand, the process 100 can make implants 216 unnecessary. Alternatively, pocket regions 216 can be formed by implantation of opposite conductivity dopants, such as a p-type dopant for an n-type transistor.

Figure 6:
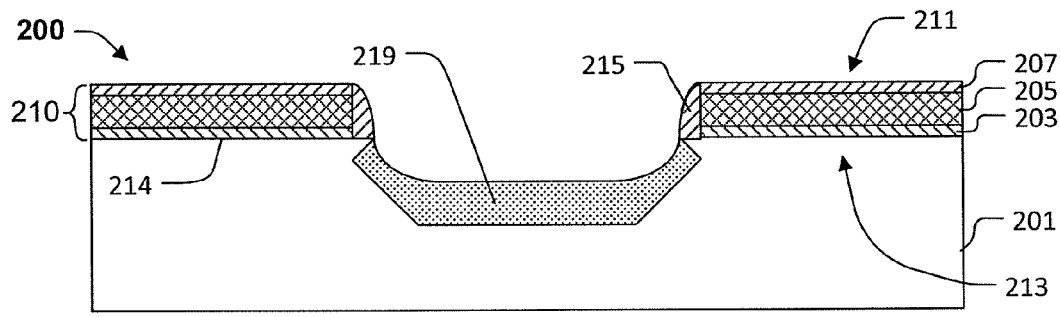

The process 100 of FIG. 1 continues with act 109, forming a first layer 219 in trenches 217 to form a structure such as the one illustrated by FIG. 6. The first layer 219 provides a conductive region of source/drain 212. In some embodiments, the first layer 219 places tensile stress on the channel region 213 of the semiconductor body 201. This is achieved by forming the first layer 219 from a crystalline material having a lattice structure smaller than that of the channel region 213. For example, where the channel region is silicon, a first layer 219 comprising SiC can provide the desired lattice structure. The addition of an n-type dopant such as phosphorus provides the desired conductivity.

In some embodiments, a first layer 219 comprising SiC:P is formed by cyclical deposition and etching (CDE). A CDE process includes deposition steps interspersed with etch-back steps. The etch back steps remove α-SiC and defective c-Si:C films. The etch can use, for example, HCl gas. The deposition can use, for example, a $Si_2H_6$-based gas mixture. The deposition temperature can be, for example, in the range from 560 to 600° C. The deposition process can be conformal or non-conformal. Due to the higher etch rate of the amorphous deposits in comparison to the mono-crystalline phase, the net effect can be growth of a single phase first layer 219.

In some embodiments, the first layer 219 is SiC:P having a relatively high carbon content and a relatively low phosphorus content. A relatively high carbon content is a carbon atomic fraction of at least 1%. The carbon atomic fraction is generally no greater than 2.5%. A relatively high carbon content reduces the diffusion rate of phosphorus through the first layer 219. A relatively low phosphorus content is 4.5e20 atoms/cm³. The phosphorus content is generally at least 1.5e20 atoms/cm³ in order to provide the desired conductivity. Reducing diffusion of phosphorus through and from the first layer 219 contributes to forming shallow junctions and mitigating short channel effects.

Figure 7:
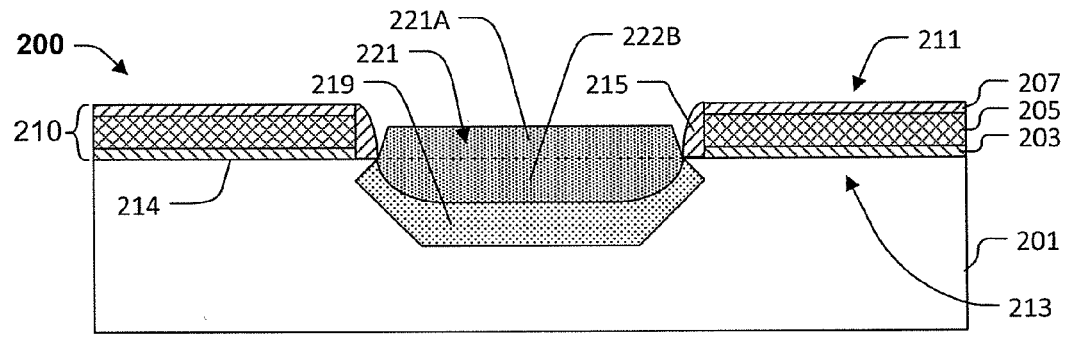

The process 100 of FIG. 1 continues with act 111, which forms a second layer 221 over the first layer 219 as illustrated in FIG. 7. Like the first layer 219, the second layer also includes an n-type dopant, which is typically phosphorus. It is desirable for the second layer 221 to release the dopant by diffusion at a high rate compared to the first layer 219. In some embodiments, the higher diffusion rate is achieved in part by providing the second layer 221 with a higher dopant concentration than the first layer. Typically, the second layer includes the dopant at a concentration in the range from 2.5e20 to 1e22 atom/cm³. In some embodiments, the second layer 221 has an atomic fraction of carbon that is less than half that of the first layer 219. Generally, the second layer 221 contains little or no carbon.

The second layer 221 can be formed by any suitable process. A suitable process can be, for example, epitaxial growth. Where the first layer 219 has been formed by CDE, the epitaxial growth can be carried out at a relatively high temperature. A relatively high temperature is, for example, 650° C. or greater. The relatively high temperature improves the process throughput. Epitaxial growth of the second layer 221 is generally carried out at a temperature of 690° C. or less.

Figure 8:
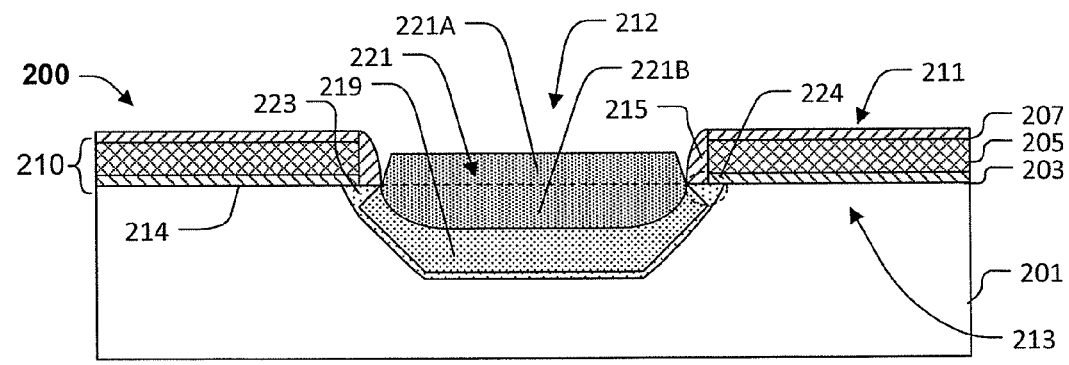

The process 100 of FIG. 1 continues with act 113, thermal annealing. Thermal annealing 113 causes dopants to diffuse from the second layer 221 to form source/drain extension regions 223, as illustrated in FIG. 8. Following thermal annealing 113, the source/drain region 212 includes the first layer 219, the second layer 221, and the source/drain extension regions 223. Thermal annealing 113 is generally a millisecond anneal. In a millisecond anneal, the semiconductor body 201 is heated to a prebake temperature. While the semiconductor body 201 is held at the prebake temperature from below, the upper surface is rapidly heated to the peak temperature.

In one embodiment that provides a desired extent of diffusion, the peak temperature is in the range from 950° C. to 1250° C. and the upper surface of the semiconductor body 201 is maintained within the temperature range from 950° C. to 1250° C. for two or more milliseconds but not more than 15 milliseconds. A prebake temperature in the range from 600° C. to 780° C. can be used in one embodiment. A desirable rate for heating the surface from the prebake to the peak temperature is in the range from 700° C./s to 900° C./s.

In some embodiments, the millisecond anneal is repeated. The dopant diffusion profile may be further improved by an additional anneal carried out at a lower temperature prior to the millisecond anneal. This additional anneal can include a prebake that raises the temperature of the semiconductor body 201 to a temperature in the range from 530° C. to 680° C., which is sustained for a period in the range from 5 to 15 seconds. The surface is heated to a peak temperature in the range from 750° C. to 1000° C. and maintained at that temperature for a period of 1 to 5 seconds duration.

The geometries and composition of the first layer 219 and the second layer 221 in combination with the annealing 113 provide shallow source/drain extension regions 223. Dopants from the second layer 221 diffuse to form a pie wedge-shaped diffusion doped area 224 adjacent the channel areas 213. In some embodiments, the dopants diffuse from 4 nm to 10 nm from second layer 221 in the direction of channel region 213. The narrow end of the pie-wedge shaped area 224, which is the end adjacent second layer 221, can have a depth (vertical extent) that is in the range from 0 to 15 nm. In some embodiments, the depth of the narrow end is less than 5 nm. In some embodiments, the depth of the narrow end is less than 2 nm. A shallow depth for the narrow end of the pie-wedge shaped area 224 facilitates forming shallow source/drain extension regions 223. In some embodiments the depth of the extension regions 223 within the area underneath the gate 211 is 15 nm or less. In some embodiments the depth of the extension regions 223 within the area underneath the gate 211 is 5 nm or less.

Formation of shallow extension regions 223 is facilitated by positioning the second layer 221 whereby its lower reach is below the surface 214 of the channel 213. In some embodiments, the second layer 221 extends to a depth that is from 2 nm to 10 nm below the plane of the surface 214 of the channel 213. In some embodiments, the second layer 221 extends to a depth that is below the plane of the surface 214 of the channel 213 by a depth that is equal to from 1/3 to 1/20 the thickness of the first layer 219.

The trench 217 of FIG. 5 is formed to a sufficient depth to accommodate that portion of the second layer 221 that is to be below the surface 214 of the channel 213 in addition to the entirety of the first layer 219. Typically, the trench 217 is formed to a depth in the range from 15 to 50 nm, 25 nm for example.

Formation of shallow source/drain extension regions 223 is further facilitated by positioning the second layer whereby its upper reach is above the plane of the surface 214 of the channel 213. The second layer 221 may include a first portion 221A that is above the surface 214 of the channel 213 and a second portion 221B below the surface 214 of the channel 213. Generally, the bulk of the second layer 221 is above the surface 214 of the channel 213. In some embodiments, the second layer extends from 10 nm to 30 nm above the plane of the channel surface 214. The second layer 221 provides a reservoir of dopants for forming the source/drain extension areas 223 during thermal annealing 113. Dopants diffusing from the second layer 221 into the source/drain extension areas 223 must generally pass through a bottleneck formed by the spacers 215 and the second layer 221. The thickness of the second layer 221 above and below the surface 214 of the channel 213 contributes to maintaining the dopant concentration adjacent this bottleneck during the annealing process 113.

The size of the bottleneck is reduced and the formation of shallow source/drains extension areas 223 is facilitated by forming the first layer in such a way that it coats the sidewalls of the trench 217. The condition of cyclical deposition and etching can be tailored to provide a deposition process that is at least partially selective to the surface on which the first layer 219 is being formed. In the present context, a selective deposition is one in which the deposition rate is proportional to the area of a particular type of surface independently from surface orientation. In some embodiments, the deposition is at least partially selective in the sense that deposition rates on the sidewalls of trenches 217 is significant in comparison to deposition rates on the bottoms of trenches 217. Whereas 20 nm is a typical thickness for the first layer 219, the bottleneck size can be reduced to the desired extend by a sidewall coating that is only 3 nm thick. The first layer 219 generally coats the sidewalls of the trench 217 to a thickness in the range from 3 nm to 10 nm.

Act 113 of process 100 is generally followed by additional front end of line (FOL) and then back end of line (BOL) processing. Additional processing can provide the device 200 with various features such as contacts/vias, interconnect metal layers, dielectric layers, passivation layers, etc. The source/drain areas 212 can be silicided, however, in one embodiment they are not silicided: the structure provided herein can have sufficiently low source/drain resistance to make siliciding unnecessary.

Isolation regions (not shown) may be formed on the body 201 prior to act 101. Isolation regions may utilize isolation technology, such as local oxidation of silicon (LOCOS) or shallow trench isolation (STI), to define and electrically isolate various active regions of the device 200.

The dielectric layer 203 can copies any suitable dielectric. $SiO_2$ or any other suitable dielectric can be used. The dielectric layer 203 can be a high-k dielectric layer, regardless of whether a gate-first or gate-last process is used. A high-k dielectric is one having a conductivity at least 5 times that of silicon dioxide. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$.

The conductive layer 205 can also be made up of one layer or multiple layers of various materials. In some embodiments, particularly those in which a high-k dielectric is used, the conductive layer 205 is one or more metal layers. A metal layer 205 generally includes at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals.

The present disclosure provides an integrated circuit device including a semiconductor body comprising crystalline silicon. A field effect transistor is formed on the semiconductor body. The transistor includes a source region, a drain region, and a channel region. The source and drain regions include a first layer formed on the semiconductor body below the plane of the upper surface of the channel region. The first layer is formed by a material comprising doped SiC and having a crystal lattice structure that is smaller than that of silicon, and the source and drain regions further comprise a second layer formed over the first layer and rising above the plane of the upper surface of the channel region. The second layer is formed by a material comprising doped epitaxially grown silicon. The second layer has an atomic fraction of carbon less than half that of the first layer. The first layer is formed to a depth at least 10 nm below the plane of the channel surface.

The present disclosure provides a method of forming an integrated circuit device. The method includes providing a semiconductor body, forming a gate or dummy gate stack on the body, and patterning the stack to remove the stack from source and drain regions of gates while leaving the patterned stack over body regions that will provide channel regions for the gates. The method further includes forming spacers for the gates on sidewalls thereof, etching trenches in the semiconductor body in the source and drain regions, and forming a first layer in the trenches by cyclical deposition and etching, the first layer comprising silicon, carbon, and phosphorus. The method still further comprises forming a second layer over the first layer by epitaxial growth, wherein the second layer comprises silicon and phosphorus, and the first and second layers provide source and drain regions for the transistors. The method also includes thermally annealing to cause phosphorus to diffuse from at least the second layer, wherein the diffused phosphorus determines the locations of p-n junctions between the source regions and drain regions and the channel regions.

The invention as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. An integrated circuit device, comprising:
a field effect transistor formed on a semiconductor body, the transistor comprising a source region and a drain region which are spaced apart from one another by a channel region in the semiconductor body, and a gate arranged over an upper planar surface of the channel region;
wherein the source and drain regions comprise:
a doped silicon carbide (SiC) layer having a planar bottom surface and a recessed upper surface, wherein an outwardly tilted lower sidewall extends upwardly from an outer edge of the planar bottom surface to an outermost tip of the doped SiC layer, and wherein an inwardly tilted upper sidewall extends from the outermost tip of the doped SiC layer to an uppermost point of the recessed upper surface, wherein the uppermost point of the recessed upper surface lies on a plane which is co-planar with the upper planar surface of the channel region;
a doped epitaxial silicon layer disposed on the recessed upper surface of the doped SiC layer, the doped epitaxial silicon layer comprising a lower portion disposed below the plane of the upper channel surface and an upper portion that protrudes above the plane of the upper channel surface with an inwardly tilted sidewall, wherein the doped epitaxial silicon layer has a dopant concentration greater than that of the doped SiC layer; and
a diffusion extension layer disposed along the bottom surface and lower sidewall of the doped SiC layer and exhibiting a pie-wedge shaped region between the upper sidewall of the doped SiC layer and the plane of the upper channel surface within the semiconductor body.

2. An integrated circuit device, comprising:
a semiconductor substrate comprising silicon;
a gate electrode extending over the semiconductor substrate and separated from the semiconductor substrate by a gate dielectric;
a source recess and a drain recess disposed in the semiconductor substrate on opposite sides of the gate electrode and separated from one another by a channel region of the semiconductor substrate under the gate dielectric, wherein the source recess or the drain recess has a bottom surface with angled lower sidewalls extending outwardly in different directions from the bottom surface and has angled upper sidewalls extending inwardly from outermost portions of the angled lower sidewalls;
a strain-inducing layer, whose lattice is made of silicon and a strain inducing component, disposed in the source or drain recess so as to abut each of the bottom surface, the angled lower sidewalls, and the angled upper sidewalls of the source or drain recess, wherein an upper surface of the strain-inducing layer has a concave recess therein; and
a doped silicon layer, which has a lattice distinct from the lattice of the strain-inducing layer, having a lower silicon portion disposed in the concave recess and having an upper silicon portion which protrudes upwardly beyond an upper surface of the semiconductor substrate.

3. The integrated circuit of claim 2, wherein the upper silicon portion has outer sidewalls which taper inwardly towards one another as the outer sidewalls extend vertically upwards from the upper surface of the semiconductor substrate.

4. The integrated circuit device of claim 2, further comprising a diffusion extension region beneath a surface of the source or drain recess.

5. The integrated circuit device of claim 4, wherein the diffusion extension region exhibits a pie-wedge shaped region between the upper sidewall of the source or drain recess and the upper surface of the semiconductor substrate.

6. An integrated circuit device, comprising:
a semiconductor substrate comprising silicon;
a gate electrode extending over the semiconductor substrate and separated from the semiconductor substrate by a gate dielectric;
a source recess and a drain recess disposed in the semiconductor substrate on opposite sides of the gate electrode and separated from one another by a channel region of the semiconductor substrate under the gate dielectric, wherein the source recess or the drain recess has a bottom surface with angled lower sidewalls extending outwardly in different directions from the bottom surface and has angled upper sidewalls extending inwardly from outermost portions of the angled lower sidewalls;
a doped SiC layer disposed in the source or drain recess so as to abut each of the bottom surface, the angled lower sidewalls, and the angled upper sidewalls of the source or drain recess, wherein an upper surface of the doped SiC layer has a concave recess therein; and
a doped epitaxial silicon layer having a lower epitaxial portion disposed in the concave recess and having an upper epitaxial portion which protrudes upwardly beyond an upper surface of the semiconductor substrate; and
a source/drain extension region disposed in the semiconductor substrate outside the doped SiC layer.

7. The integrated circuit device of claim 6, wherein the doped SiC-layer has an atomic fraction of carbon that is from about 1% to about 2.5%.

8. The integrated circuit device of claim 6, wherein:
the doped epitaxial silicon layer has a phosphorus concentration of 2.5e20 to 1e22 atom/cm$^3$; and
the doped SiC layer has a phosphorus concentration less than 2.5e20 atom/cm$^3$.

9. The integrated circuit device of claim 6, wherein the doped epitaxial silicon layer rises to at least 10 nm above the upper surface of the semiconductor substrate.

10. The integrated circuit device of claim 9, wherein the lower epitaxial portion extends to a depth at least 2 nm below the upper surface of the semiconductor substrate.

11. The integrated circuit device of claim 10, wherein the thickness of the lower epitaxial portion below the upper surface of the semiconductor substrate is from ⅓ to 1/20 the thickness of the SiC layer.

12. The integrated circuit device of claim 6, wherein a thickness of the doped SiC layer separates the doped epitaxial silicon layer from the semiconductor substrate by at least 3 nm.

13. The integrated circuit device of claim 6, wherein the doped SiC layer has a phosphorus concentration less than that of the doped epitaxial silicon layer.

14. The integrated circuit device of claim 6, wherein the doped epitaxial silicon layer has a phosphorus concentration of at least 2.5e20 atom/cm$^3$.

15. The integrated circuit device of claim 14,
wherein the source and drain extension region have a phosphorous concentration gradient in which phosphorous concentration is decreasing toward the channel.

16. The integrated circuit device of claim 6, further comprising a diffusion extension region beneath a surface of the source or drain recess.

17. The integrated circuit device of claim 16, wherein the diffusion extension region has a phosphorous concentration monotonically decreasing from a position closer to the doped SiC-layer to a position further from the doped SiC layer.

18. The integrated circuit device of claim 16, wherein the diffusion extension exhibits a pie-wedge shaped region between the upper sidewall of the source or drain recess and the upper surface of the semiconductor substrate.

19. The integrated circuit of claim 6, wherein the upper epitaxial portion has outer sidewalls which taper inwardly towards one another as the outer sidewalls extend vertically upwards from the upper surface of the semiconductor substrate.

* * * * *